(12) United States Patent
Saino

(10) Patent No.: US 7,413,968 B2
(45) Date of Patent: Aug. 19, 2008

(54) METHOD OF MANUFACTURING SEMICONDUCTOR DEVICE HAVING GATE ELECTRODES OF POLYMETAL GATE AND DUAL-GATE STRUCTURE

(75) Inventor: Kanta Saino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 206 days.

(21) Appl. No.: 11/328,225

(22) Filed: Jan. 10, 2006

(65) Prior Publication Data

US 2006/0154462 A1 Jul. 13, 2006

(30) Foreign Application Priority Data

Jan. 13, 2005 (JP) ............... 2005-006678

(51) Int. Cl.
*H01L 21/425* (2006.01)
*H01L 21/8238* (2006.01)
*H01L 21/3205* (2006.01)
*H01L 21/4763* (2006.01)

(52) U.S. Cl. ............... 438/527; 438/530; 438/199; 438/592; 257/E21.635; 257/E21.636

(58) Field of Classification Search .......... 257/E21.635, 257/E21.636; 438/199, 163, 527, 530, 592
See application file for complete search history.

(56) References Cited

U.S. PATENT DOCUMENTS

| 6,524,904 | B1 * | 2/2003 | Segawa et al. ............... 438/232 |
| 6,555,885 | B2 * | 4/2003 | Komori ............... 257/410 |
| 6,602,771 | B2 * | 8/2003 | Inoue et al. ............... 438/585 |
| 6,638,803 | B2 * | 10/2003 | Mori et al. ............... 438/199 |

(Continued)

FOREIGN PATENT DOCUMENTS

JP 08-306802 11/1996

(Continued)

OTHER PUBLICATIONS

Chinese Office Action, with English Translation, issued in Chinese Patent Application No. 200610005789.5, dated on Nov. 30, 2007.

*Primary Examiner*—Carl Whitehead, Jr.
*Assistant Examiner*—Daniel Luke
(74) *Attorney, Agent, or Firm*—McDermott Will & Emery LLP

(57) ABSTRACT

A silicon film is formed on a first region and a second region, respectively of a semiconductor substrate; P-type impurities are selectively ion-implanted into the silicon film in the first region; a first annealing is carried out, thereby the P-type impurities implanted in the silicon film are activated; N-type impurities are selectively ion-implanted into the silicon film in the second region, after the first annealing; a silicide film is formed on the silicon film according to a CVD method, after the ion-implantation of the N-type impurities; a second annealing is carried out, thereby gas contained in the silicide film is discharged and the N-type impurities are activated; a barrier metal film and a metal film are formed in this order on the silicide film; and the metal film, the barrier metal film, the silicide film and the silicon film are patterned, thereby a P-type polymetal gate electrode formed in the first region and an N-type polymetal gate electrode formed in the second region.

19 Claims, 14 Drawing Sheets

U.S. PATENT DOCUMENTS

| | | |
|---|---|---|
| 2002/0090757 A1 | 7/2002 | Komori |
| 2002/0110969 A1 | 8/2002 | Mori et al. |
| 2004/0108553 A1* | 6/2004 | Nohsoh et al. .............. 257/351 |
| 2004/0132240 A1* | 7/2004 | Kojima et al. ............... 438/199 |
| 2004/0188702 A1* | 9/2004 | Bruderl et al. .............. 257/103 |
| 2004/0224450 A1* | 11/2004 | Itonaga et al. .............. 438/197 |
| 2005/0224799 A1* | 10/2005 | Yamamoto et al. ........... 257/66 |

FOREIGN PATENT DOCUMENTS

| | | |
|---|---|---|
| JP | 09-051040 | 2/1997 |
| JP | 09-190983 | 7/1997 |
| JP | 09-246206 | 9/1997 |
| JP | 2000-077540 | 3/2000 |
| JP | 2002-208695 | 7/2002 |

* cited by examiner

METHOD OF MANUFACTURING SEMICONDUCTOR DEVICE HAVING GATE ELECTRODES OF POLYMETAL GATE AND DUAL-GATE STRUCTURE

TECHNICAL FIELD

The present invention relates to a method of manufacturing a semiconductor device. Particularly, the invention relates to a method of manufacturing a semiconductor device having gate electrodes of a polymetal gate structure and a dual-gate structure.

BACKGROUND OF THE INVENTION

In recent years, there is a high demand for a high speed and low power consumption of a semiconductor device, particularly for a dynamic random access memory (DRAM). In order to meet this demand, a polymetal gate structure and a dual-gate structure are employed.

The polymetal gate structure has metal films laminated on a polycrystalline silicon film. The polymetal gate structure can have lower resistance than that of a polycide gate structure that has been conventionally used. In general, the polymetal gate structure has a barrier metal (such as a tungsten nitride (WN) film), and a metal film (such as a tungsten (W) film), laminated together on the polycrystalline silicon film. However, this polymetal gate structure has a problem in that interface resistance, that is, contact resistance between the barrier metal film and the polycrystalline silicon film, becomes nonlinearly high. Therefore, the polymetal gate structure having the silicide film present between the polycrystalline silicon film and the barrier metal film has come to be employed.

On the other hand, according to the dual-gate structure, a gate electrode that contains N-type polycrystalline silicon having N-type impurities (such as phosphorus) implanted in the polycrystalline silicon, is used for the gate electrode of an NMOS transistor, and a gate electrode that contains P-type polycrystalline silicon having P-type impurities (such as boron) implanted in the polycrystalline silicon, is used for the gate electrode of a PMOS transistor. Because the PMOS transistor has a surface-channel type in the dual-gate structure, a short-channel effect can be suppressed when the gate length is short. This is advantageous in increasing the performance of the transistor. Furthermore, because a threshold level can be decreased from that of the conventional embedded channel-type MOS transistor, the driving voltage can be lowered.

A conventional method of manufacturing the gate electrodes having the polymetal gate structure and the dual-gate structure will be explained with reference to FIGS. 12 to 20. In FIGS. 12 to 20, a "region N" represents a region where the gate electrode containing N-type polycrystalline silicon is formed, and a "region P" represents a region where the gate electrode containing P-type polycrystalline silicon is formed.

First, as shown in FIG. 12, a silicon oxide film 202a is formed on the surface of a silicon substrate 201 by thermal oxidation. Next, as shown in FIG. 13, the silicon oxide film 202a is nitrided by plasma nitrization, thereby forming a gate oxynitride film 202.

Next, as shown in FIG. 14, an amorphous silicon film 203a is formed on the gate oxynitride film 202.

Next, as shown in FIG. 15, the region P is covered with a resist film 204, and phosphorus is ion-implanted as N-type impurities into the region N. Thereafter, the resist film 204 is removed.

Next, as shown in FIG. 16, the region N is then covered with a resist film 205, and boron is ion-implanted as P-type impurities into the region P.

As shown in FIG. 17, after the resist film 205 is removed, a tungsten silicide (WSi) film 206 is formed on the whole surface of the amorphous silicon film 203a, according to a CVD method using a mixed gas of $WF_6$ and $SiH_2Cl_2$. The WSi film 206 can be also formed by a physical vapor deposition (PVD) method such as sputtering. However, when the PVD method is used, oxygen is mixed into the film, and the oxygen increases sheet resistance of the WSi film. The CVD method is therefore used.

As shown in FIG. 18, a rapid thermal annealing (RTA) is carried out in the atmosphere of 700 to 950° C. for 10 to 60 seconds, as what is called degasification, to discharge gases of chlorine, fluorine and so on that remain in the WSi film 206 formed in the CVD method, to the outside. By this RTA, the N-type impurities and the P-type impurities that are implanted into the amorphous silicon 203a are simultaneously activated, and the amorphous silicon film 203a is converted into a polycrystalline silicon film. Consequently, an N-type polycrystalline silicon film 203n and a P-type polycrystalline silicon film 203p are formed on the gate oxynitride film 202, respectively.

Next, as shown in FIG. 19, a tungsten nitride (WN) film 207 and a tungsten (W) film 208 are sequentially formed on the WSi film 206 by sputtering. Furthermore, a silicon nitride film 209 of a gate electrode pattern is formed on the tungsten (W) film 208. Thereafter, as shown in FIG. 20, the W film 208, the WN film 207, tungsten silicide (WSi) film 206 and the polycrystalline silicon films 203n and 203p are patterned, using the silicon nitride film 209 as a mask, thereby completing an N-type polymetal gate electrode 210n and a P-type polymetal gate electrode 210p.

Methods of manufacturing the semiconductor device having the gate electrodes of the polymetal gate structure and the dual-gate structure are described in, for example, Japanese Patent Application Laid-open Nos. 2000-77540, H8-306802, H9-51040, H9-190983, and H9-246206.

FIG. 21 is a graph showing a relationship between the RTA temperature when degassing the WSi film 206, the interface resistance of the N-type polymetal gate electrode 210n (the contact resistance between the N-type polycrystalline silicon 203n and the WSi film 206), and the interface resistance of the P-type polymetal gate electrode 210p (the contact resistance between the P-type polycrystalline silicon 203p and the WSi film 206). "N-gate" represents the interface resistance of the N-type polymetal gate electrode 210n, and "P-gate" represents the interface resistance of the P-type polymetal gate electrode 210p. A value 1.0 in the vertical axis represents a standard value of the interface resistance.

As shown in FIG. 21, according to the above conventional manufacturing method, there is no temperature range of RTA in which both the interface resistance of the N-type polymetal gate electrode 210n and the interface resistance of the P-type polymetal gate electrode 210p satisfy the standard value of the interface resistance. In the temperature range where the interface resistance of the N-type polymetal gate electrode 210n satisfies the standard value, the interface resistance of the P-type polymetal gate electrode 210p becomes very high as compared with the interface resistance of the N-type polymetal gate electrode 210n.

As explained above, when there is a large difference between the interface resistance of the N-type polymetal gate electrode and the interface resistance of the P-type polymetal gate electrode, the following problems arise.

FIGS. 22A and 22B show a ring oscillator circuit. FIG. 22A shows a circuit symbol, and FIG. 22B shows a circuit diagram. As shown in FIG. 22A, an output OUT of an inverter 300 returns to an input IN. As shown in FIG. 22B, the inverter 300 includes a PMOS transistor 301 and an NMOS transistor 302. These gate electrodes employ a polymetal gate structure and a dual-gate structure.

In the ring oscillator circuit as shown in FIGS. 22A and 22B, when the interface resistance of the polymetal gate electrode of the PMOS transistor 301 is much higher than the interface resistance of the polymetal gate electrode of the NMOS transistor 302 (corresponding to a region A shown in FIG. 21), as shown in FIG. 23A, the waveform of the rise of the output signal OUT is slowed down to a large extent as compared with the waveform of the input signal IN. On the other hand, when the interface resistance of the polymetal gate electrode of the NMOS transistor 302 is much higher than the interface resistance of the polymetal gate electrode of the PMOS transistor 301 (corresponding to a region B shown in FIG. 21), as shown in FIG. 23B, the waveform of the fall of the output signal OUT is slowed down to a large extent as compared with the waveform of the input signal IN.

SUMMARY OF THE INVENTION

The present invention has been achieved to solve the above problems. It is an object of the present invention to provide a method of manufacturing a semiconductor device capable of decreasing both the interface resistance of an N-type polymetal gate electrode and the interface resistance of a P-type polymetal gate electrode, respectively in the semiconductor device having gate electrodes of a polymetal gate structure and a dual-gate structure.

The method of manufacturing a semiconductor device according to the present invention includes: a first step for forming a silicon film on a first region and a second region, respectively of a semiconductor substrate; a second step for selectively ion-implanting P-type impurities into the silicon film in the first region; a third step for carrying out a first annealing, thereby activating the P-type impurities implanted in the silicon film; a fourth step for selectively ion-implanting N-type impurities into the silicon film in the second region, after the third step; a fifth step for forming a silicide film on the silicon film according to a CVD method, after the fourth step; a sixth step for carrying out a second annealing, thereby discharging gas contained in the silicide film and activating the N-type impurities; a seventh step for forming a barrier metal film and a metal film in this order on the silicide film; and an eighth step for patterning the metal film, the barrier metal film, the silicide film and the silicon film, thereby forming a P-type polymetal gate electrode in the first region and an N-type polymetal gate electrode in the second region.

According to the present invention, both the interface resistance of the P-type polymetal gate electrode and the interface resistance of the N-type polymetal gate electrode (the contact resistance of the silicon film and the silicide film) can be decreased. The decrease of the interface resistances is considered to be able to be achieved because of the following reasons. Based on the first annealing, the P-type impurities are activated and is accommodated within a crystal grating of the silicon film, thereby obtaining a stable state. In this stable state, diffusion of the P-type impurities to the direction of the semiconductor substrate can be prevented, in the second annealing. Consequently, concentration of the P-type impurities near the interface can be maintained at a high level.

As explained above, according to the present invention, the P-type impurities are ion-implanted into the silicon film, and first annealing is carried out to activate the P-type impurities, in advance. Thereafter, the N-type impurities are ion-implanted into the silicon film, and the silicide film is formed. Second annealing is then carried out to degas the silicide film and to activate the N-type impurities. In other words, before the barrier metal film is formed, the region into which the P-type impurities are implanted is thermally annealed twice. With this arrangement, both the interface resistance of the P-type polymetal gate electrode and the interface resistance of the N-type polymetal gate electrode can be decreased.

BRIEF DESCRIPTION OF THE DRAWINGS

The above and other objects, features and advantages of the present invention will become more apparent by reference to the following detailed description of the invention taken in conjunction with the accompanying drawings, wherein.

DETAILED DESCRIPTION OF THE EMBODIMENTS

Preferred embodiments of the present invention will be explained below with reference to the accompanying drawings.

FIGS. 1 to 10 are schematic process diagrams of steps of manufacturing a semiconductor device having gate electrodes of polymetal gate and dual-gate structures according to an embodiment of the present invention. In FIGS. 1 to 10, a "region N" represents the region where a gate electrode containing N-type polycrystalline silicon is formed, and a "region P" represents the region where a gate electrode containing P-type polycrystalline silicon is formed.

Figure 1:
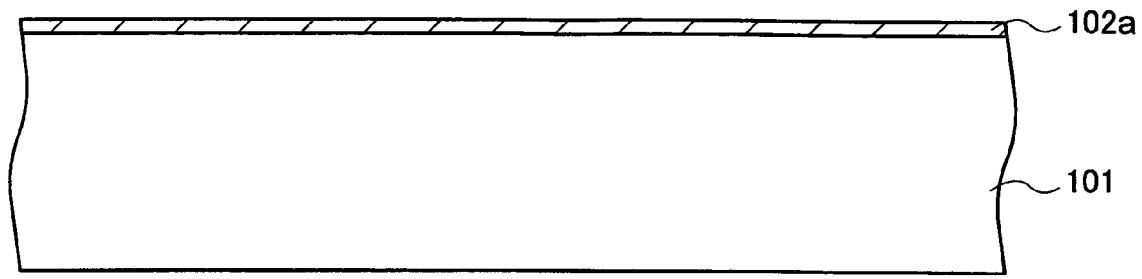
FIG. 1 is a cross-sectional diagram showing one step (formation of a silicon oxide film 102a) of a method of manufacturing a semiconductor device according to a preferred embodiment of the present invention.

First, as shown in FIG. 1, the surface of a silicon substrate 101 is thermally oxidized in the $H_2$—$N_2$—$O_2$ atmosphere, at a temperature within a range of 750 to 900° C., preferably at 850° C., thereby forming a silicon oxide film 102a having a thickness within a range of 1.5 to 200 nanometers (nm), preferably about 6 nm.

Figure 2:
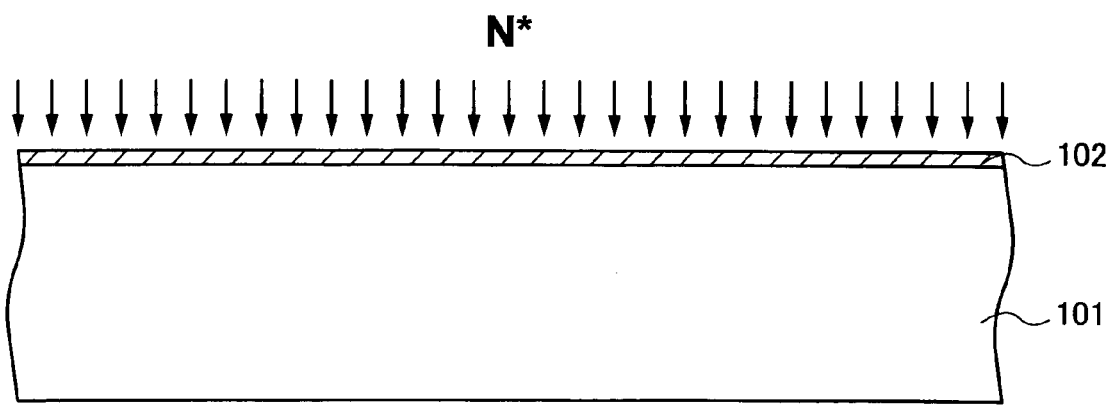
FIG. 2 is a cross-sectional diagram showing one step (formation of a gate oxynitride film 102) of the method of manufacturing the semiconductor device according to the preferred embodiment of the present invention.

Next, as shown in FIG. 2, the silicon oxide film 102a is nitrided by plasma nitrization, thereby forming a gate oxynitride film 102.

Figure 3:
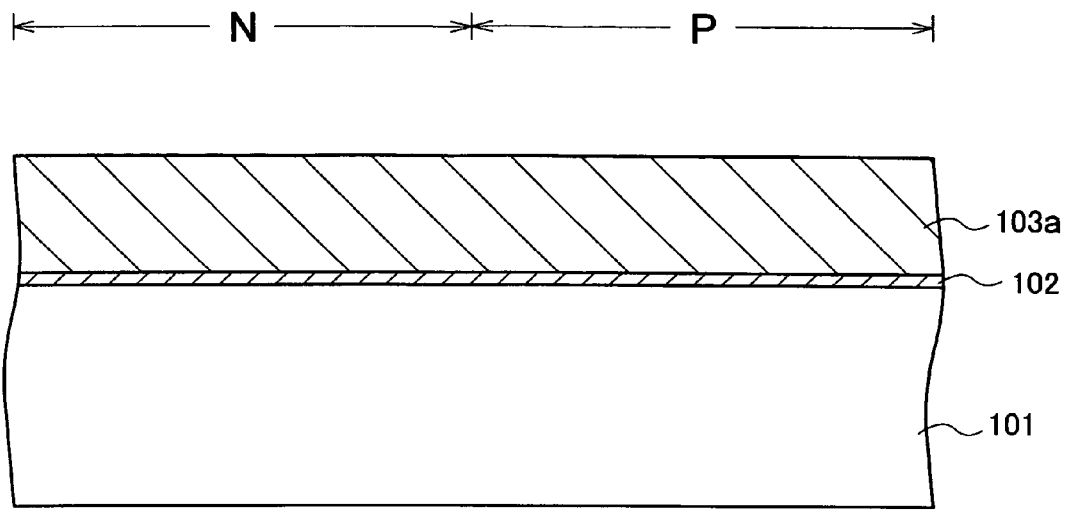
FIG. 3 is a cross-sectional diagram showing one step (formation of an amorphous silicon film 103a) of the method of manufacturing the semiconductor device according to the preferred embodiment of the present invention.

Next, as shown in FIG. 3, an amorphous silicon film 103a having a thickness within a range of 50 to 150 nm, preferably about 100 nm, is formed on the gate oxynitride film 102, according to a CVD method, at a film-forming temperature within a range of 550 to 650° C., preferably at 550° C.

Figure 4:
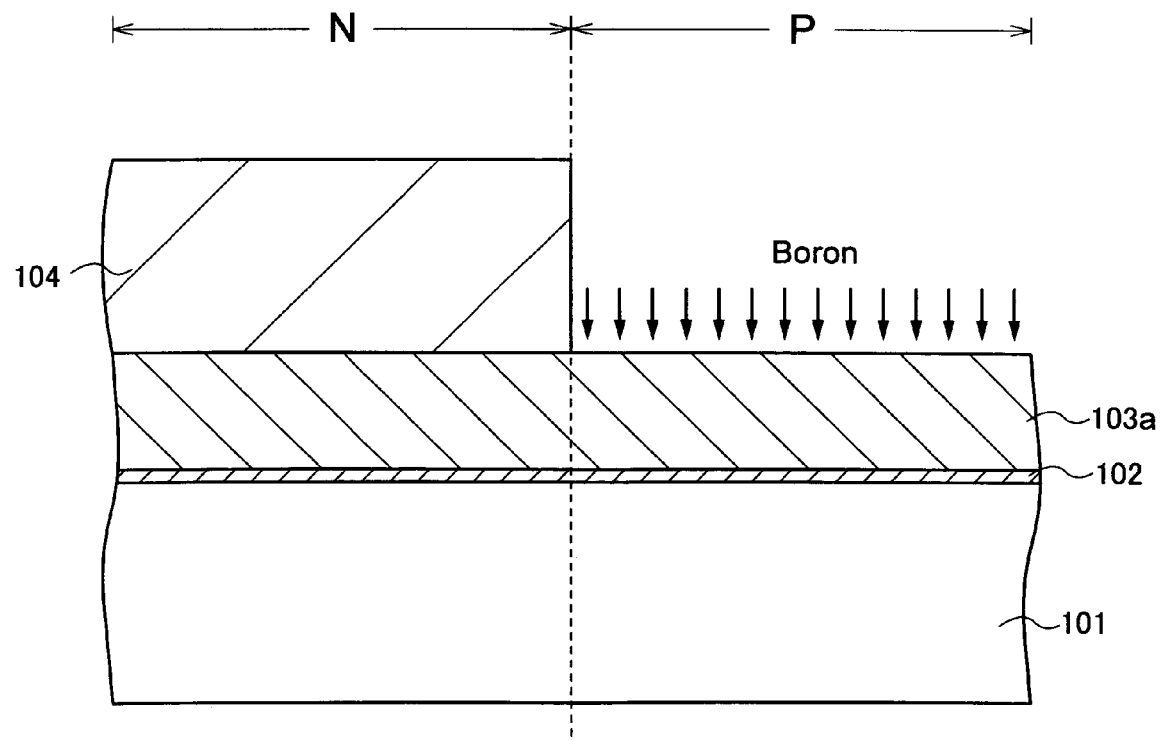
FIG. 4 is a cross-sectional diagram showing one step (ion-implantation of P-type impurities) of the method of manufacturing the semiconductor device according to the preferred embodiment of the present invention.

Next, as shown in FIG. 4, the region N is covered with a resist film 104, and boron (B) ions are ion-implanted as P-type impurities into the region P, using energy within a range of 3 to 10 keV, preferably about 5 keV, at a rate within a range of $1.5 \times 10^{15}/cm^2$ to $5 \times 10^{15}/cm^2$, preferably at about $2.5 \times 10^{15}/cm^2$. A projected range Rp is preferably about 16 nm so that the ions are implanted into the surface region of the amorphous silicon film 103a.

Figure 5:
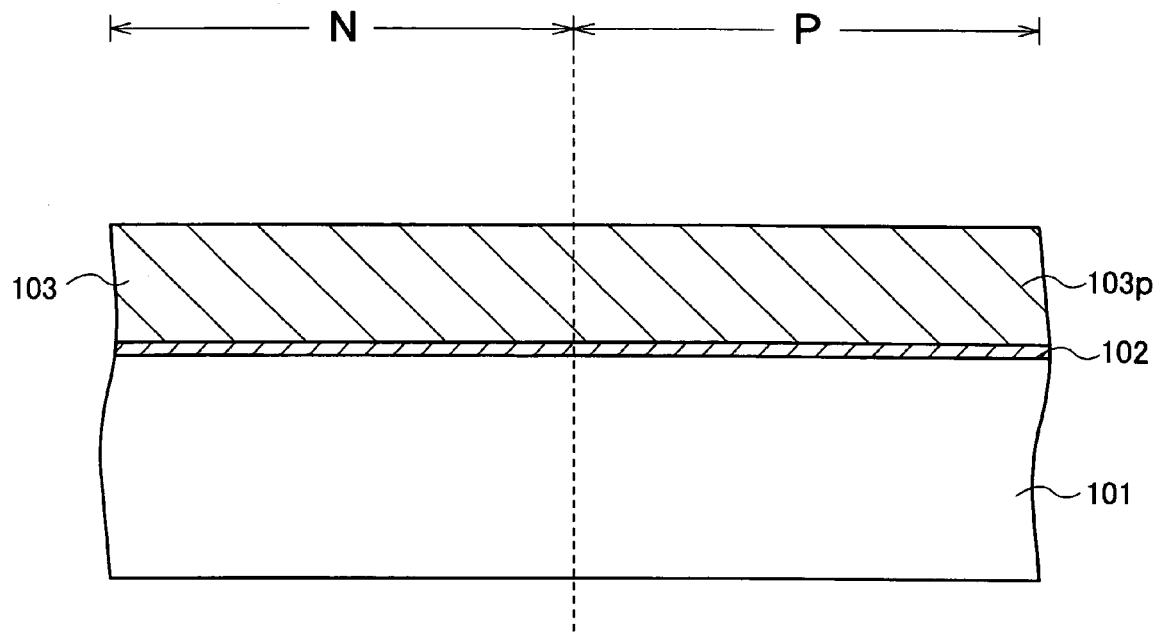
FIG. 5 is a cross-sectional diagram showing one step (RTA for activating the P-type impurities) of the method of manufacturing the semiconductor device according to the preferred embodiment of the present invention.

Next, the resist film 104 is removed by $O_2$ plasma treatment or the like. Thereafter, an RTA is carried out at a temperature within a range of 700 to 950° C., for 10 to 60 seconds, in the atmosphere of 100% of $N_2$ or diluted $O_2$, thereby activating the boron ions implanted in the amorphous silicon film 103a in the region P. At this time, as shown in FIG. 5, the amorphous silicon film 103a is converted into a polycrystalline silicon film 103, and the polycrystalline silicon film 103 in the region P becomes a P-type polycrystalline silicon film 103p. Preferably, in order to avoid boron penetration (a phenomenon in which boron ions are diffused in a gate insulating film by RTA, and exuded on a substrate), the RTA is carried out during a short time of about 10 seconds, at about 950° C., in the atmosphere of about 1% of $O_2$.

Figure 6:
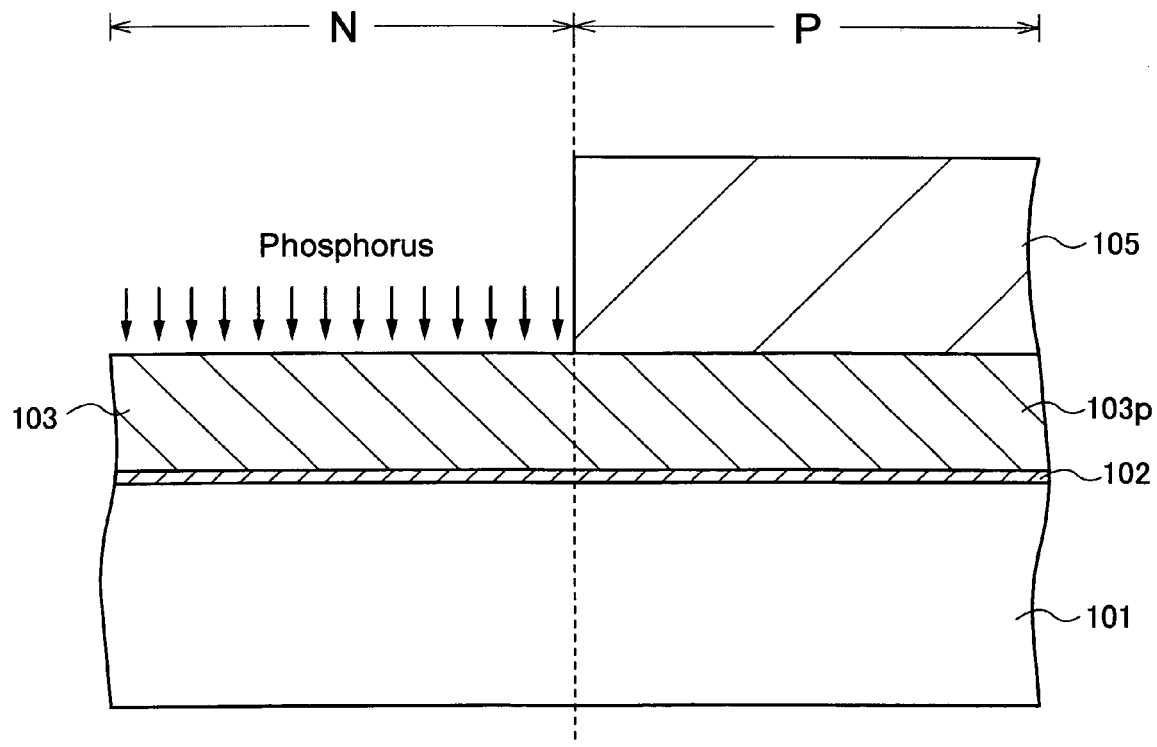
FIG. 6 is a cross-sectional diagram showing one step (ion-implantation of N-type impurities) of the method of manufacturing the semiconductor device according to the preferred embodiment of the present invention.

Next, as shown in FIG. 6, the region P is covered with a resist film 105, and phosphorus ions are ion-implanted as N-type impurities in the region N, using energy within a range of 5 to 20 keV, preferably about 10 keV, at a rate within a range of $4 \times 10^{15}/cm^2$ to $8 \times 10^{15}/cm^2$, preferably at about $5 \times 10^{15}/cm^2$. A projected range Rp is preferably about 14 nm so that the ions are implanted into the surface region of the polycrystalline silicon film 103.

Figure 7:
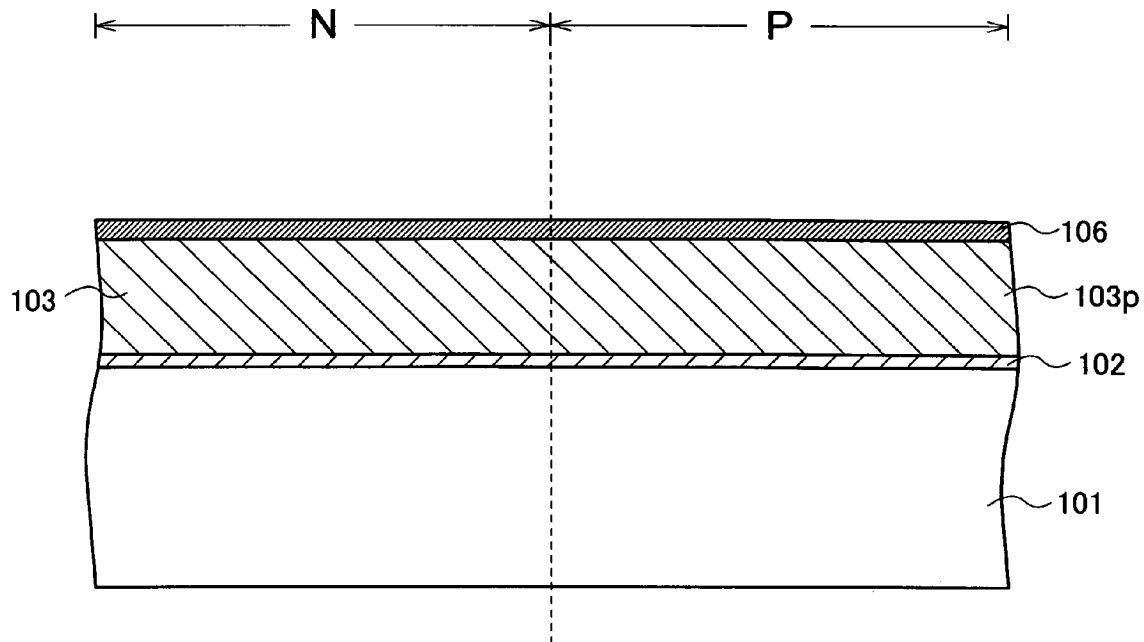
FIG. 7 is a cross-sectional diagram showing one step (formation of a WSi film 106) of the method of manufacturing the semiconductor device according to the preferred embodiment of the present invention.

Next, after the resist film 105 is removed, the oxide film formed by a heat treatment in the $O_2$ atmosphere on the surface of the polycrystalline silicon film 103 is removed by surface cleaning. Thereafter, as shown in FIG. 7, a tungsten silicide (WSi) film 106 having a thickness within a range of 2 to 10 nm, preferably about 5 nm, is formed on the whole surface of the polycrystalline silicon film 103, by the CVD method, using a mixed gas of $WF_6$ and $SiH_2Cl_2$, at a film-forming temperature within a range of 500 to 600° C., preferably at about 580° C.

Figure 8:
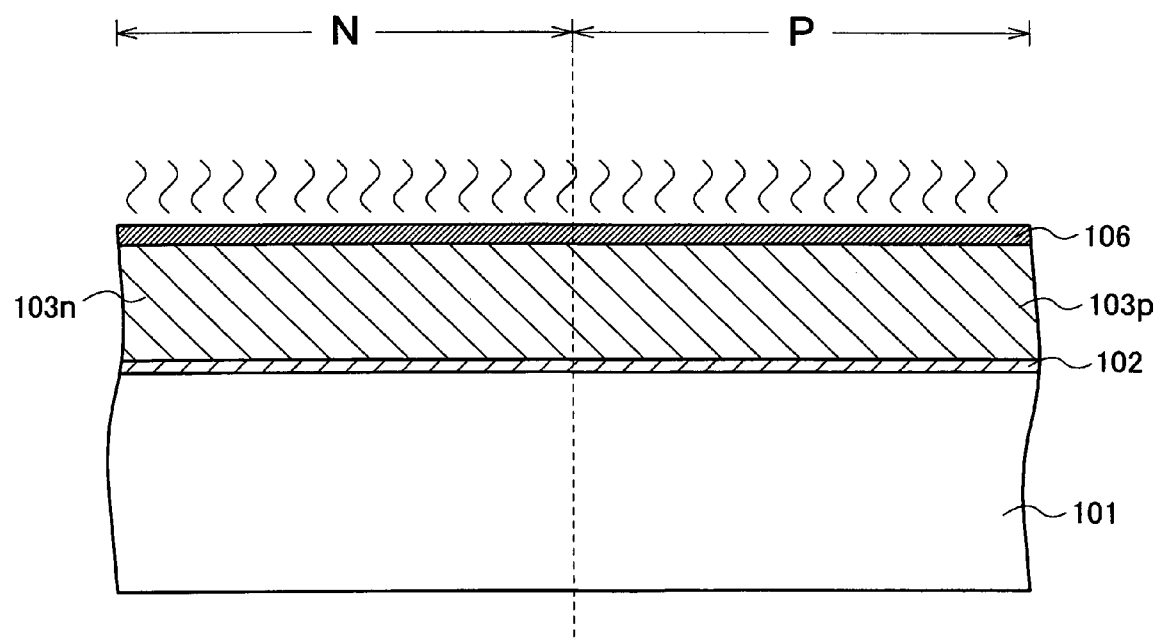
FIG. 8 is a cross-sectional diagram showing one step (RTA for degassing from the WSi film 106) of the method of manufacturing the semiconductor device according to the preferred embodiment of the present invention.

Thereafter, an RTA is carried out at a temperature within a range of 700 to 950° C., for 10 to 60 seconds, in the $N_2$ 100% atmosphere, thereby degassing gases of chlorine, fluorine and so on contained in the WSi film 106 at the film-forming time by the CVD method, as shown in FIG. 8. Based on this RTA, simultaneously with the degassing from the WSi film 106, the N-type impurities (phosphorus) which are implanted into the polycrystalline silicon film 103 and is not yet activated is activated. The polycrystalline silicon film 103 in the N region becomes an N-type polycrystalline silicon film 103n.

When this RTA time is too short or when the temperature of this RTA is too low, the resistance at the interface between the polycrystalline silicon film 103 and the WSi film 106 becomes high. This is considered because of the following. In a short-time RTA at a low temperature, chlorine and fluorine remain within the WSi film 106. Therefore residual chlorine or fluoride gas causes oxidation of WSi film 106 during the later process. That is, when heat is added to the WSi film 106 in the later process, the interface is oxidized or nitrided. Also, when excessive annealing is applied, impurity concentration at the interface between the polycrystalline silicon film 103 and the WSi film 106 decreases due to diffusion of the implanted impurities. Conversely, when the RTA temperature is too high or when the RTA time is too long, the resistance of the interface increases. Therefore, the RTA is carried out at a temperature within a range of 780 to 850° C., preferably at about 800° C., for about 30 seconds.

Figure 9:
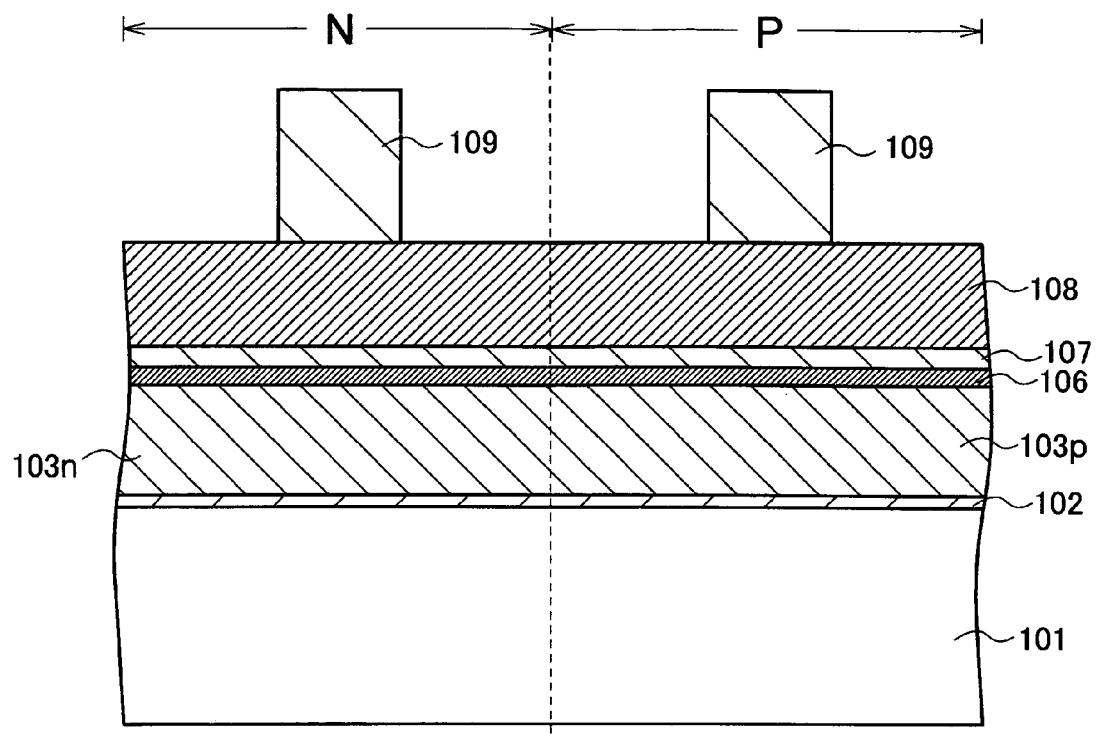
FIG. 9 is a cross-sectional diagram showing one step (formation of a WN film 107, a W film 108 and a silicon nitride film 109) of the method of manufacturing the semiconductor device according to the preferred embodiment of the present invention.
Figure 10:
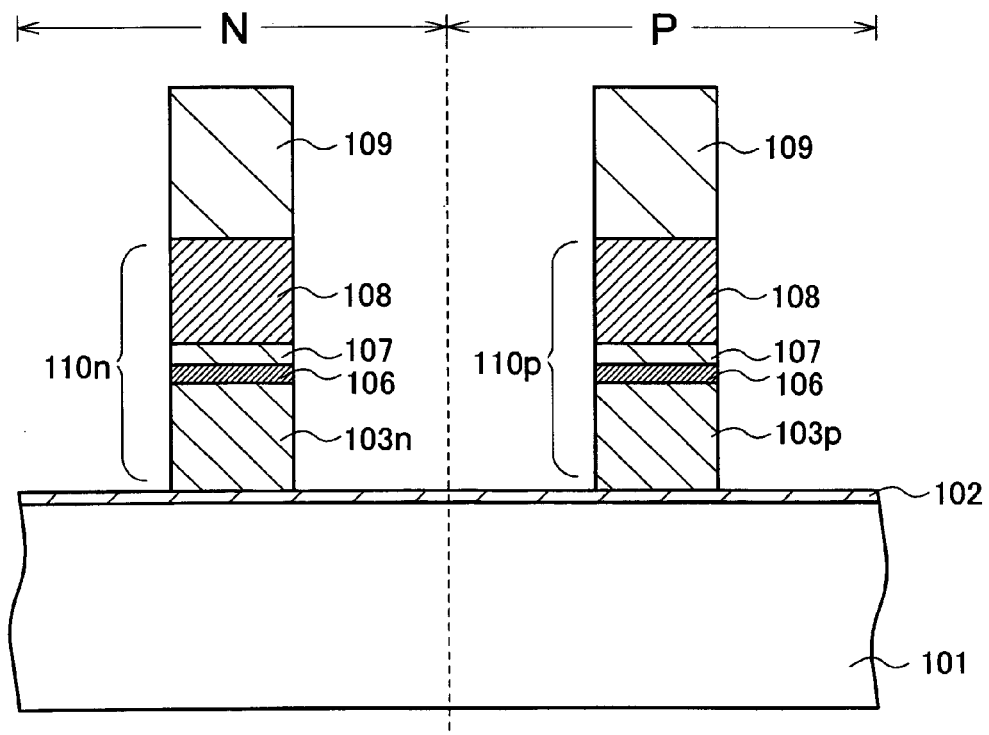
FIG. 10 is a cross-sectional diagram showing one step (patterning for formation of gate electrodes 110n and 110p) of the method of manufacturing the semiconductor device according to the preferred embodiment of the present invention.

Next, as shown in FIG. 9, a tungsten nitride (WN) film 107 and a tungsten (W) film 108 are sequentially formed on the WSi film 106 by sputtering. Furthermore, a silicon nitride film 109 as a gate electrode pattern is formed on the tungsten (W) film 108. Thereafter, as shown in FIG. 10, the W film 108, the WN film 107, the WSi film 106 and the polycrystalline silicon films 103n and 103p are patterned, using the silicon nitride film 109 as a mask, thereby completing an N-type polymetal gate electrode 10n that includes the N-type poly silicon 103n, the WSi film 106, the WN film 107, and the W film 108, and completing a P-type polymetal gate electrode 110p that includes the P-type polycrystalline silicon 103p, the WSi film 106, the WN film 107, and the W film 108.

Figure 11:
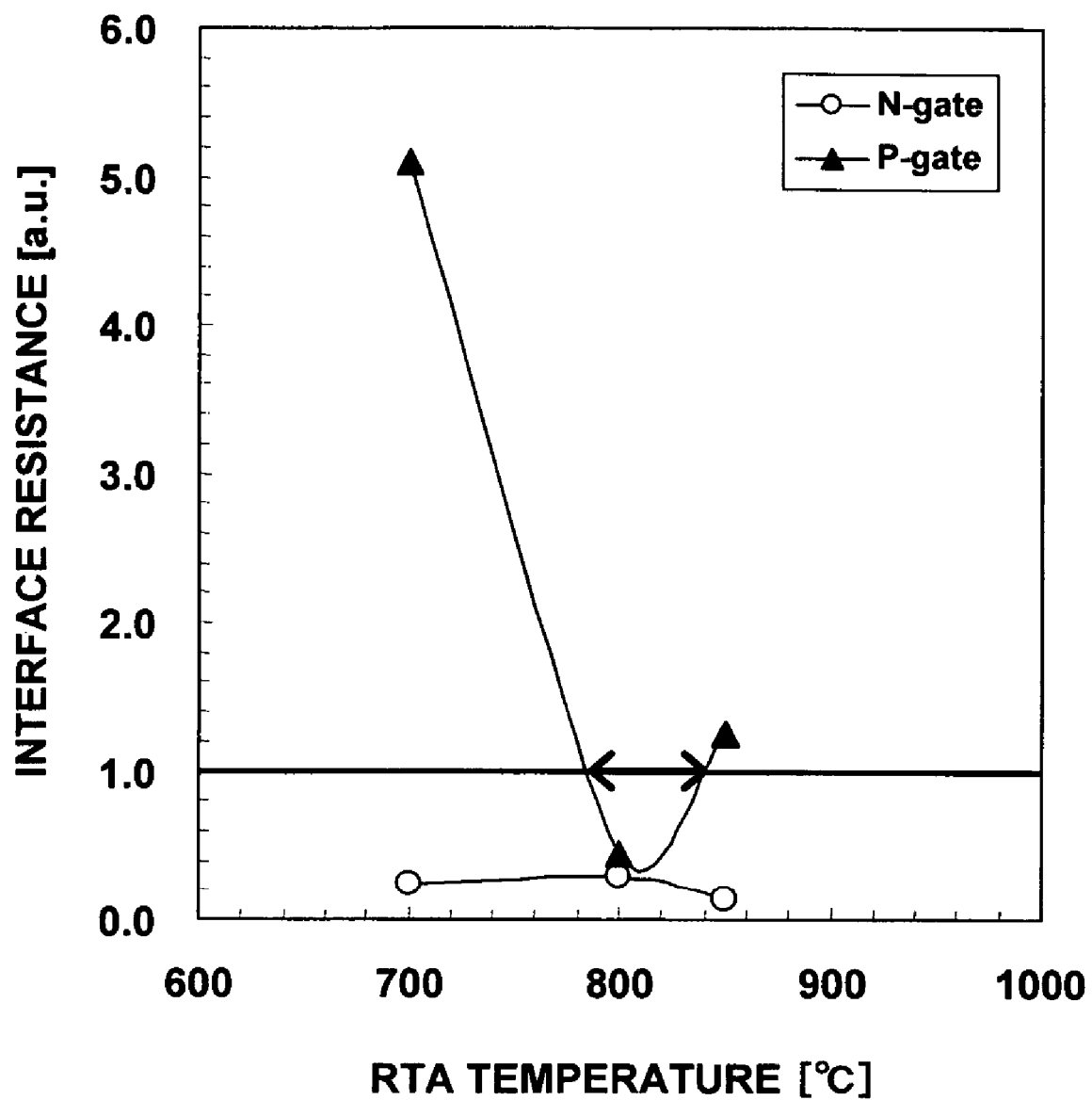
FIG. 11 is a graph showing a relationship between the RTA temperature when degassing the WSi film 106, the interface resistance of the N-type polymetal gate electrode 110n and the interface resistance of the P-type polymetal gate electrode 110p, in the manufacturing method according to the preferred embodiment of the present invention.
Figure 12:
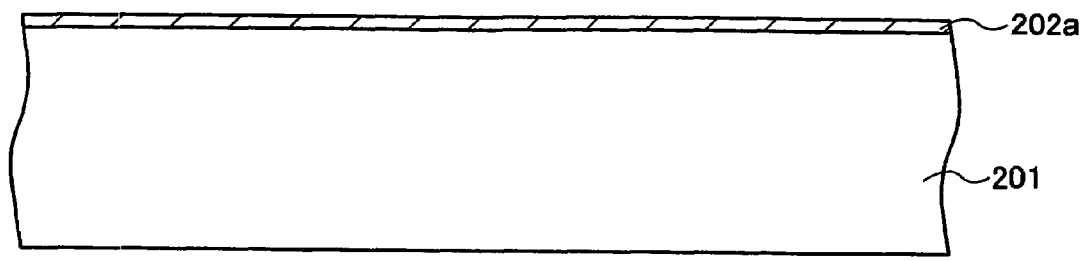
FIG. 12 is a cross-sectional diagram showing one step (formation of a silicon oxide film 202a) of a method of manufacturing a semiconductor device according to a conventional method.
Figure 13:
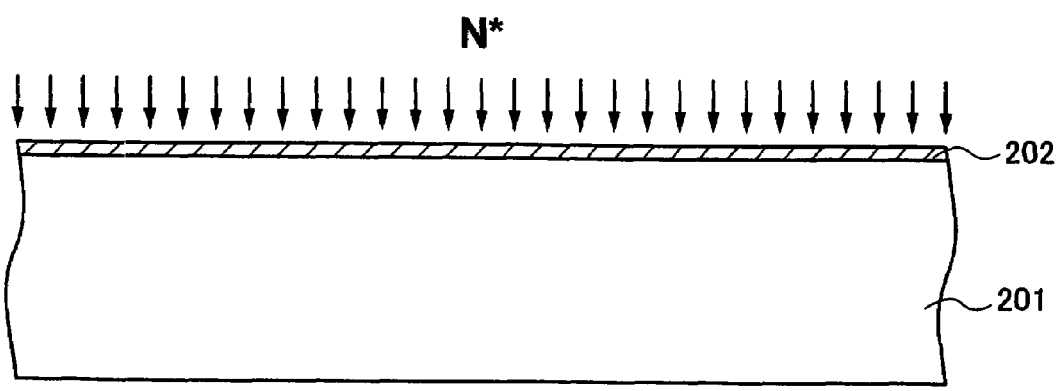
FIG. 13 is a cross-sectional diagram showing one step (formation of a gate oxynitride film 202) of the method of manufacturing the semiconductor device according to the conventional method.
Figure 14:
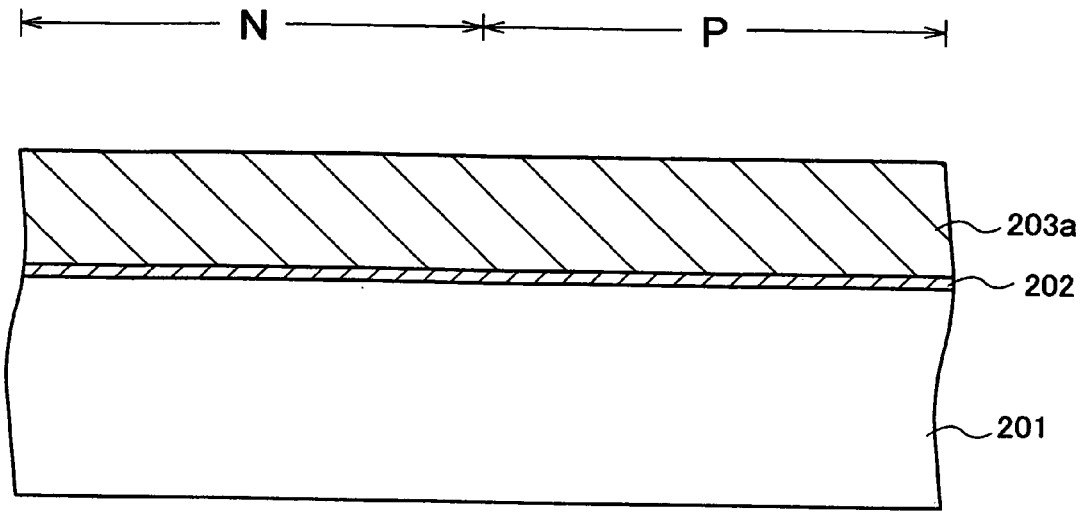
FIG. 14 is a cross-sectional diagram showing one step (formation of an amorphous silicon film 203) of the method of manufacturing the semiconductor device according to the conventional method.
Figure 15:
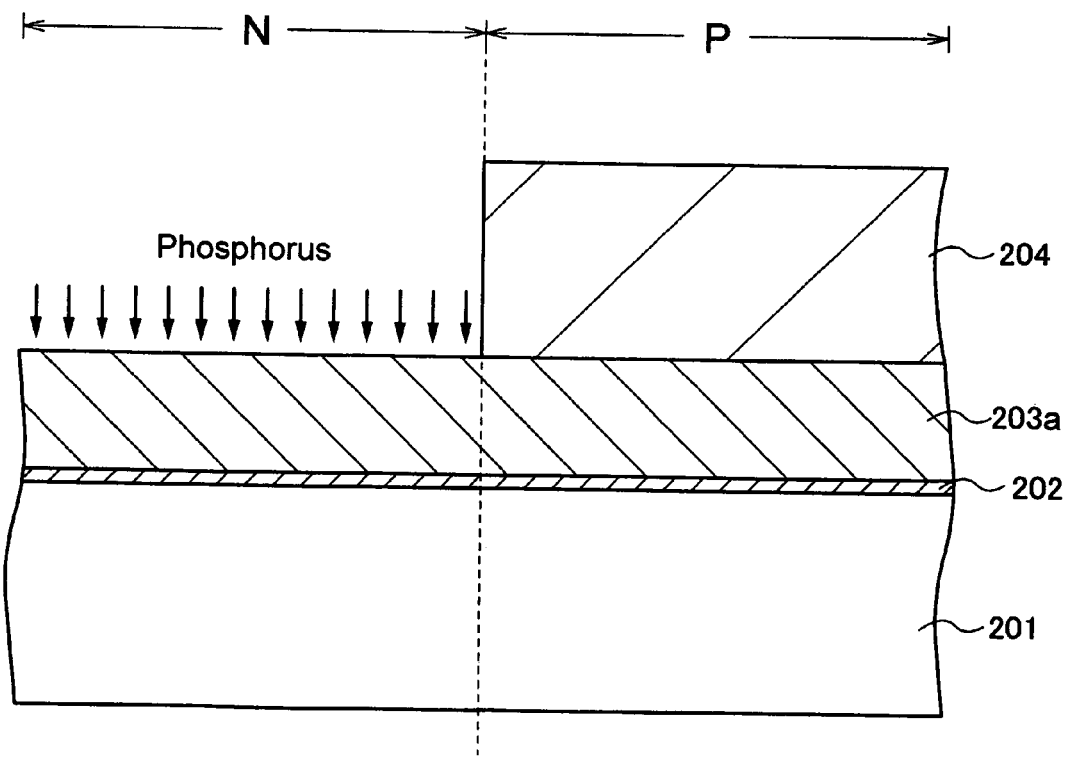
FIG. 15 is a cross-sectional diagram showing one step (ion-implantation of N-type impurities) of the method of manufacturing the semiconductor device according to the conventional method.
Figure 16:
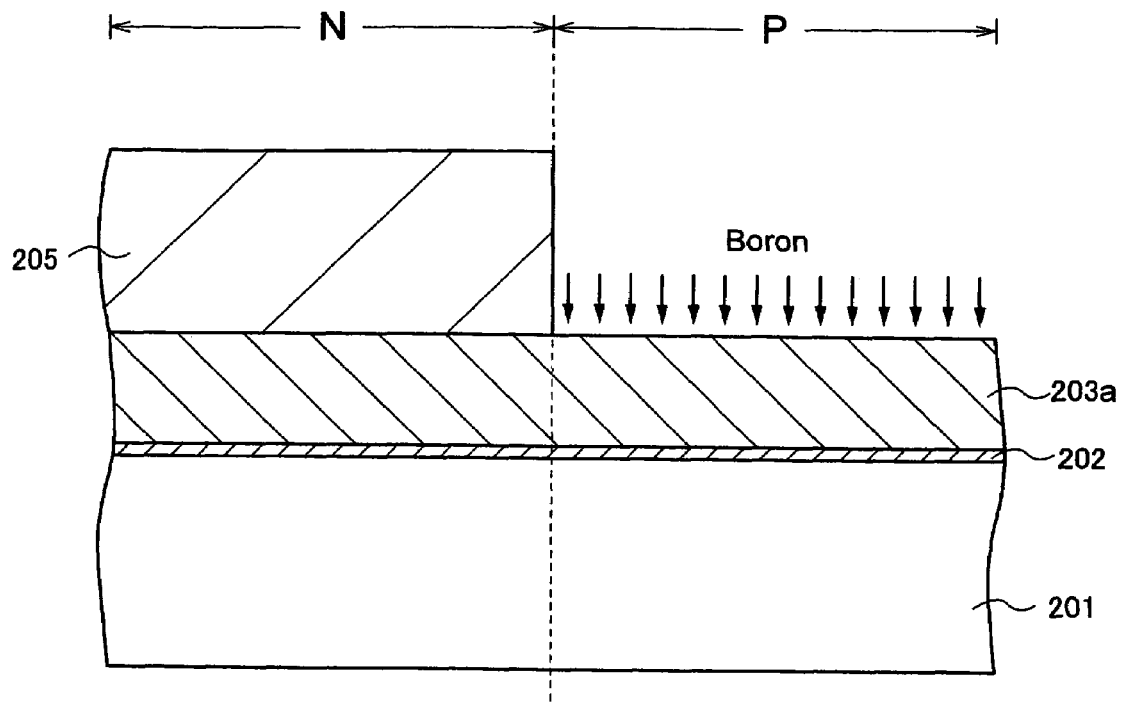
FIG. 16 is a cross-sectional diagram showing one step (ion-implantation of P-type impurities) of the method of manufacturing the semiconductor device according to the conventional method.
Figure 17:
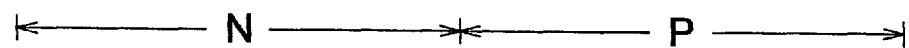
FIG. 17 is a cross-sectional diagram showing one step (formation of WSi 206) of the method of manufacturing the semiconductor device according to the conventional method.
Figure 18:
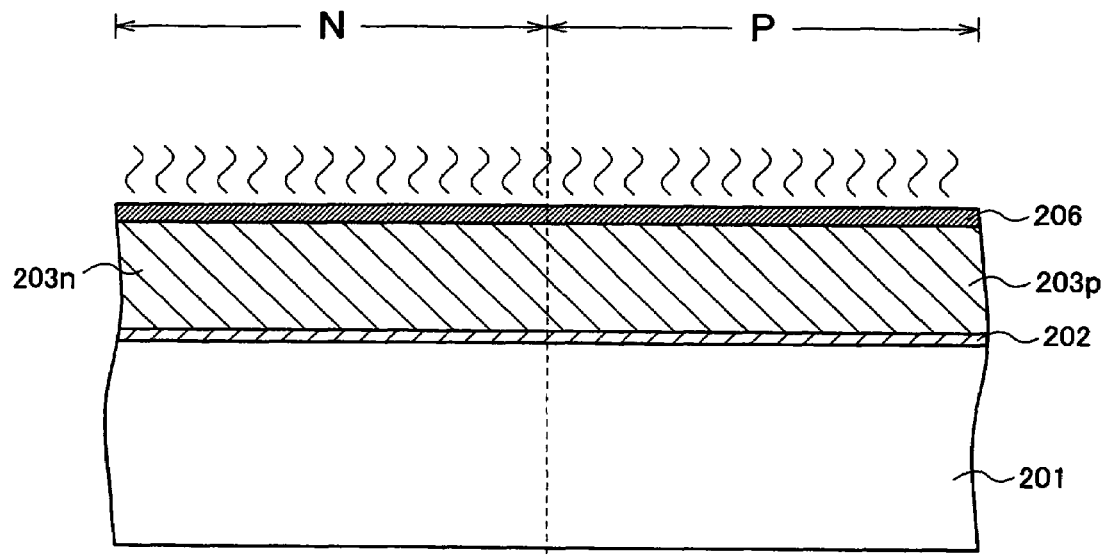
FIG. 18 is a cross-sectional diagram showing one step (RTA for degassing from the WSi film 206) of the method of manufacturing the semiconductor device according to the conventional method.
Figure 19:
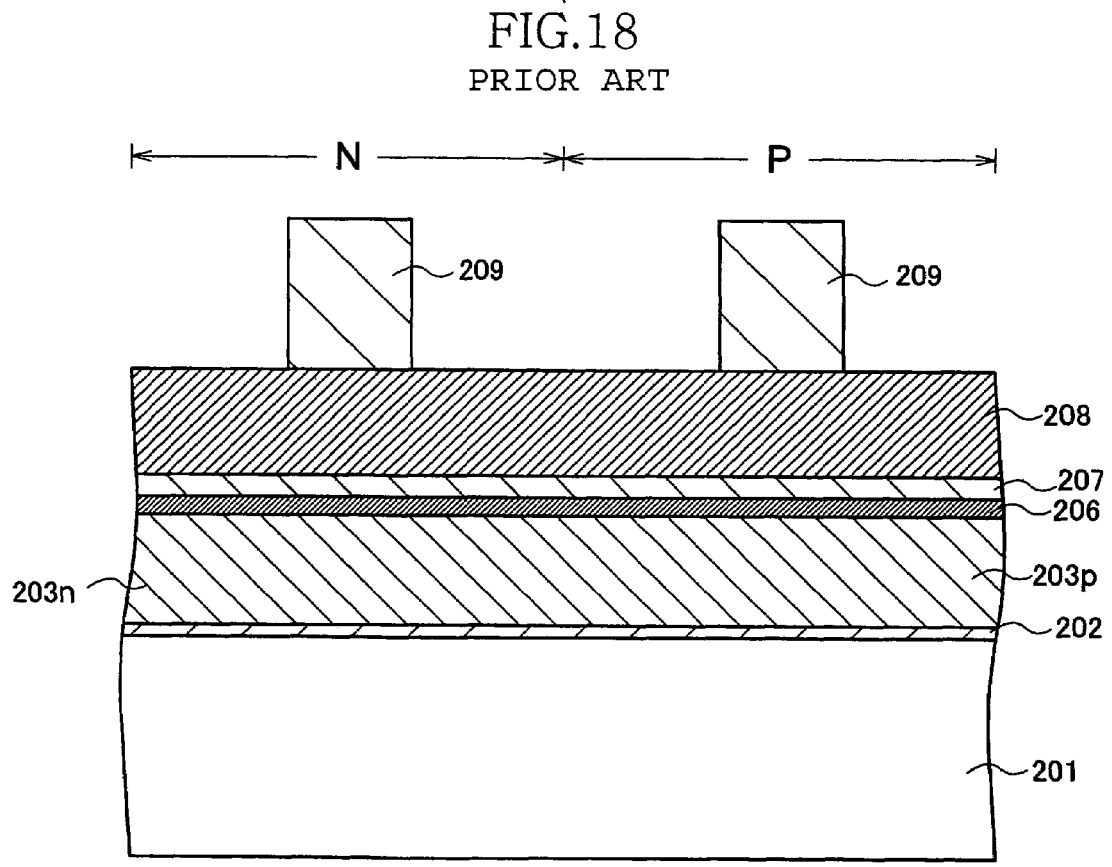
FIG. 19 is a cross-sectional diagram showing one step (formation of a WN film 207, a W film 208 and a silicon nitride film 209) of the method of manufacturing the semiconductor device according to the conventional method.
Figure 20:
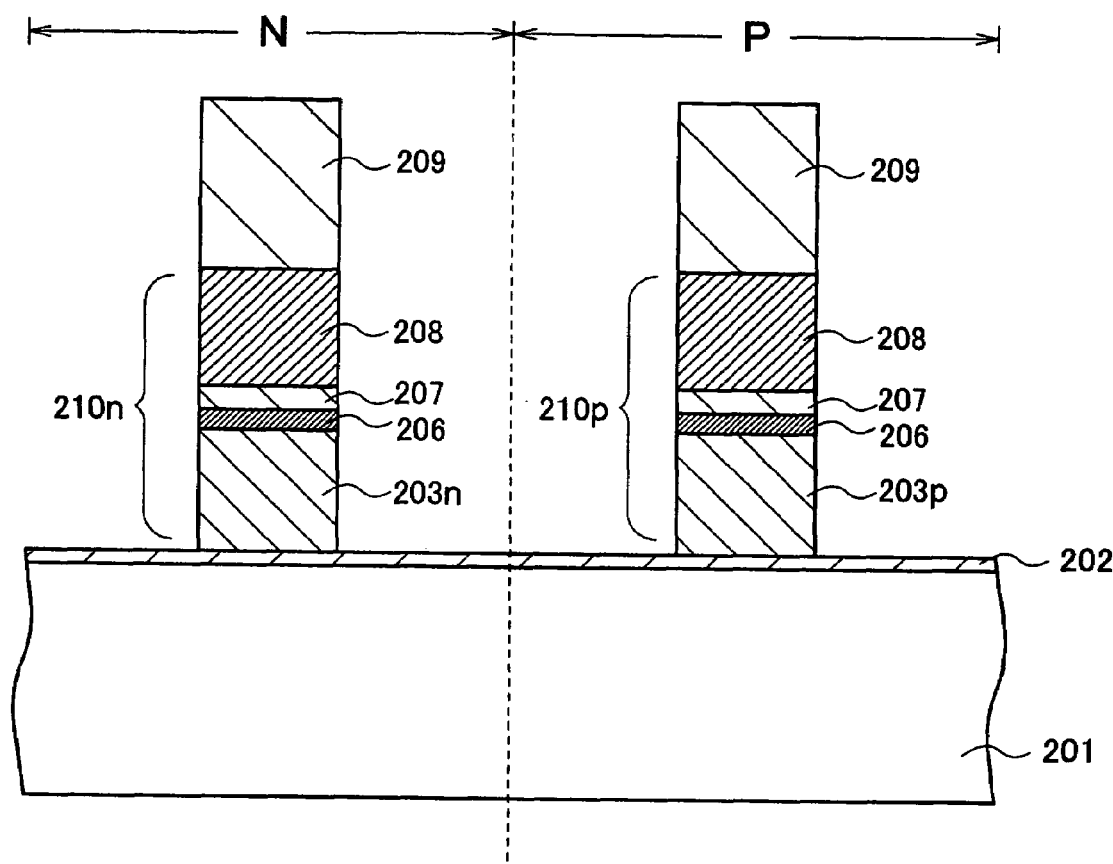
FIG. 20 is a cross-sectional diagram showing one step (patterning for formation of gate electrodes 210n and 210p) of the method of manufacturing the semiconductor device according to the conventional method.

FIG. 11 is a graph showing a relationship between the RTA temperature when degassing the WSi film 106, the interface resistance of the N-type polymetal gate electrode 110n (the contact resistance between the N-type polycrystalline silicon 103n and the WSi film 106), and the interface resistance of the P-type polymetal gate electrode 110p (the contact resistance between the P-type polycrystalline silicon 103p and the WSi film 106), in the manufacturing method according to the present embodiment. "N-gate" represents the interface resistance of the N-type polymetal gate electrode 10n. "P-gate" represents the interface resistance of the P-type polymetal gate electrode 110p. A value 1.0 in the vertical axis represents a standard value of the interface resistance.

As shown in FIG. 11, there is a temperature range of RTA in which the interface resistance of the P-type polymetal gate electrode 110p satisfies the standard value of the interface resistance. In the temperature range where the interface resistance of the P-type polymetal gate electrode 110n satisfies the standard value, the interface resistance of the N-type polymetal gate electrode 110n also satisfies the standard value (the range of ≲ shown in FIG. 11). Therefore, when the WSi film 106 is degassed by an RTA in this temperature range, both the interface resistance of the N-type polymetal gate electrode 110n and the interface resistance of the P-type polymetal gate electrode 110p can be decreased.

Figure 21:
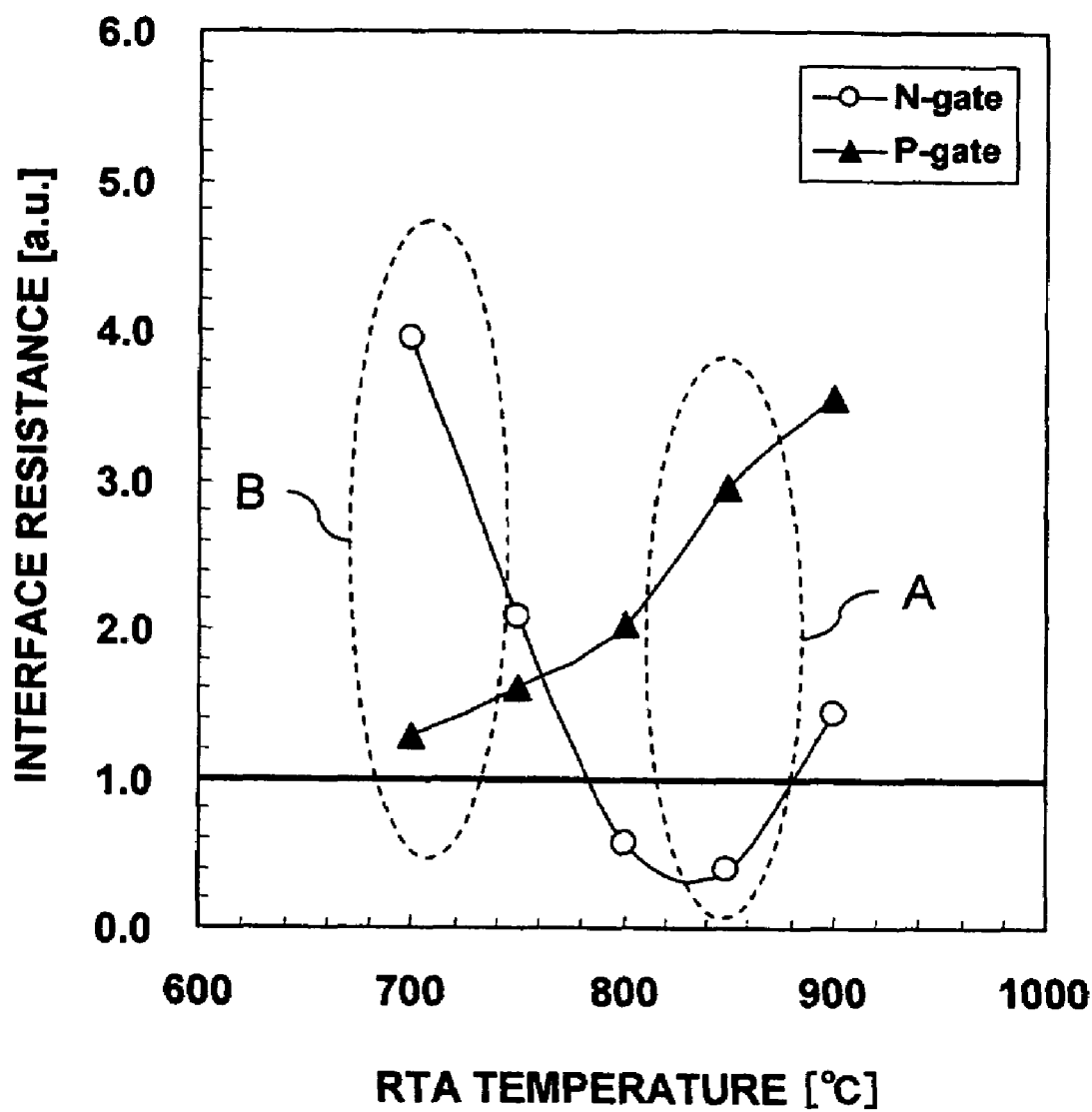
FIG. 21 is a graph showing a relationship between the RTA temperature when degassing the WSi film 206, the interface resistance of the N-type polymetal gate electrode 210n, and the interface resistance of the P-type polymetal gate electrode 210p.
Figure 22A:
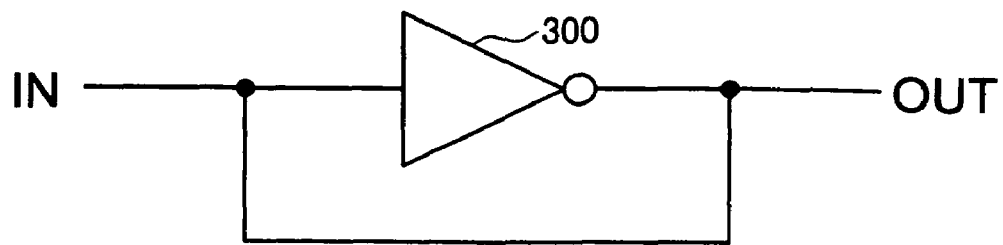
FIGS. 22A and 22B are a circuit symbol and a circuit diagram of a ring oscillator circuit.
Figure 22B:
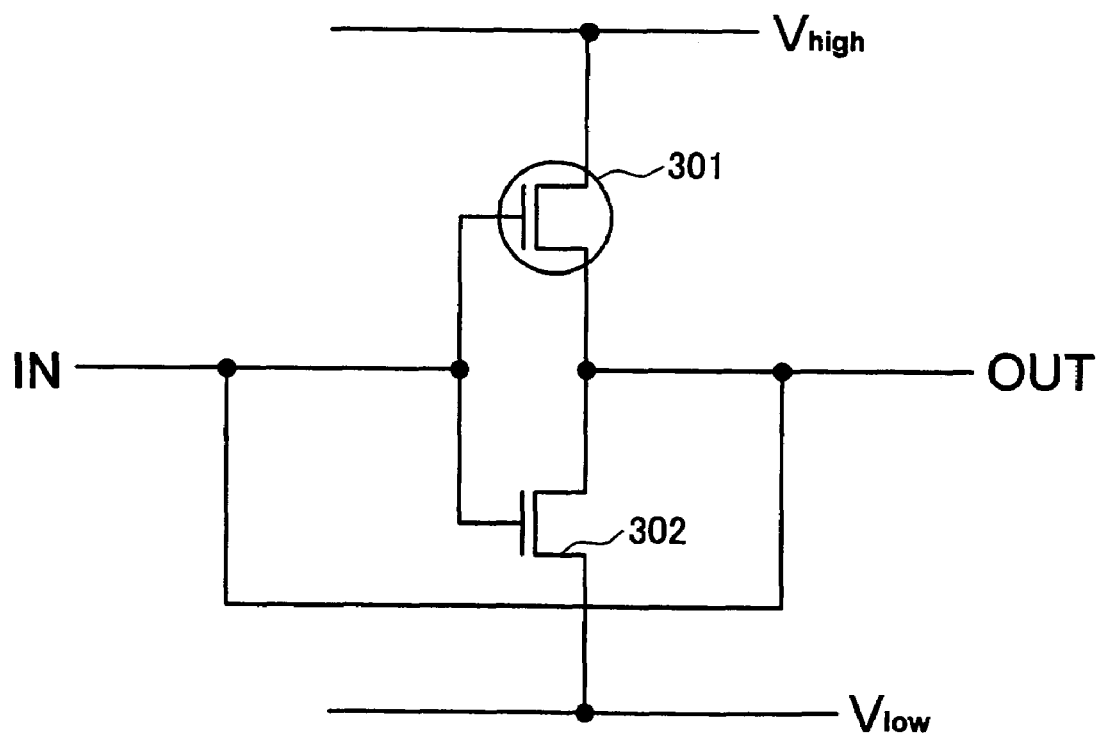
Figure 23A:
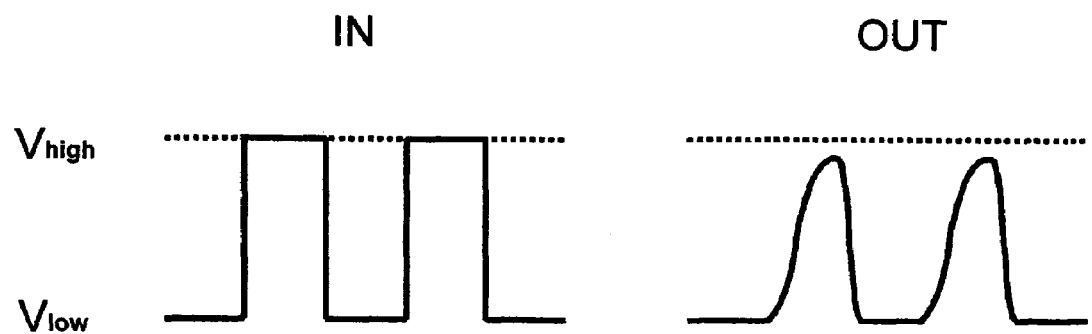
FIGS. 23A and 23B are diagrams showing a relationship between an input signal IN and an output signal OUT of the circuit shown in FIGS. 22A and 22B.
Figure 23B:
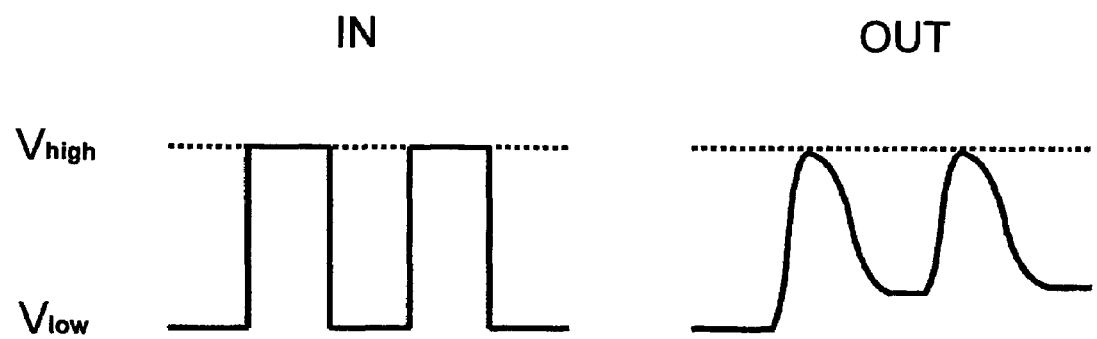

As explained above, both the interface resistance of the N-type polymetal gate electrode and the interface resistance of the P-type polymetal gate electrode can be decreased. Therefore, when the ring oscillator as shown in FIG. 21 is structured by a MOS transistor having these polymetal gate electrodes, the rising waveform and the falling waveform of the output signal OUT are not substantially delayed. Consequently, a high-speed circuit operation can be obtained.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, in the above embodiment, while the amorphous silicon film 103a is formed in the process shown in FIG. 3, a polycrystalline silicon film can be also used in place of the amorphous silicon film.

While phosphorus is used for the N-type impurity and boron is used for the P-type impurity in the above embodiment, other kinds of impurity can be also used. For example, arsenic or antimony can be also used for the N-type impurity, and indium or boron fluoride can be also used for the P-type impurity. For the P-type impurity, both boron and indium can be also ion-implanted. In this case, indium can be ion-implanted into the surface region of the amorphous silicon 103a, and boron can be ion-implanted into a deep region. Because indium is not easily diffused as compared with boron, it does not make much movement when an RTA is carried out. Consequently, concentration of the P-type impurity in the surface region can be held at a higher level, and the interface resistance can be decreased.

While P-type impurities are selectively ion-implanted into the P region and N-type impurities are selectively ion-implanted into the N region in the above embodiment, the P-type impurities can be ion-implanted into the entire region (including the P region and the N region), and after that, the N-type impurities can be selectively ion-implanted into the N region by increasing the dose.

What is claimed is:

1. A method of manufacturing a semiconductor device comprising:
    a first step for forming a silicon film on a first region and a second region, respectively of a semiconductor substrate;
    a second step for selectively ion-implanting P-type impurities into the silicon film in the first region;
    a third step for carrying out a first annealing, thereby activating the P-type impurities implanted in the silicon film;
    a fourth step for selectively ion-implanting N-type impurities into the silicon film in the second region, after the third step;
    a fifth step for forming a silicide film on the silicon film according to a CVD method, after the fourth step;
    a sixth step for carrying out a second annealing, thereby discharging gas contained in the silicide film and activating the N-type impurities, after the fifth step;
    a seventh step for forming a barrier metal film and a metal film in this order on the silicide film; and
    an eighth step for patterning the metal film, the barrier metal film, the silicide film and the silicon film, thereby forming a P-type polymetal gate electrode in the first region and an N-type polymetal gate electrode in the second region.

2. The method of manufacturing a semiconductor device as claimed in claim 1, wherein the silicide film is a tungsten silicide (WSi) film.

3. The method of manufacturing a semiconductor device as claimed in claim 1, wherein a film thickness of the silicide film is within a range of 2 to 10 nm.

4. The method of manufacturing a semiconductor device as claimed in claim 1, wherein the barrier metal film is a tungsten nitride (WN) film, and the metal film is a tungsten (W) film.

5. The method of manufacturing a semiconductor device as claimed in claim 1, wherein the second annealing is carried out at a temperature within a range of 780 to 850° C.

6. The method of manufacturing a semiconductor device as claimed in claim 2, wherein the second annealing is carried out at a temperature within a range of 780 to 850° C.

7. The method of manufacturing a semiconductor device as claimed in claim 3, wherein the second annealing is carried out at a temperature within a range of 780 to 850° C.

8. The method of manufacturing a semiconductor device as claimed in claim 4, wherein the second annealing is carried out at a temperature within a range of 780 to 850° C.

9. The method of manufacturing a semiconductor device as claimed in claim 1, wherein the first annealing is carried out at a higher temperature and for a shorter period of time than those of the second annealing.

10. The method of manufacturing a semiconductor device as claimed in claim 2, wherein the first annealing is carried out at a higher temperature and for a shorter period of time than those of the second annealing.

11. The method of manufacturing a semiconductor device as claimed in claim 3, wherein the first annealing is carried out at a higher temperature and for a shorter period of time than those of the second annealing.

12. The method of manufacturing a semiconductor device as claimed in claim 4, wherein the first annealing is carried out at a higher temperature and for a shorter period of time than those of the second annealing.

13. The method of manufacturing a semiconductor device as claimed in claim 5, wherein the first annealing is carried out at a higher temperature and for a shorter period of time than those of the second annealing.

14. The method of manufacturing a semiconductor device as claimed in claim 6, wherein the first annealing is carried out at a higher temperature and for a shorter period of time than those of the second annealing.

15. The method of manufacturing a semiconductor device as claimed in claim 7, wherein the first annealing is carried out at a higher temperature and for a shorter period of time than those of the second annealing.

16. The method of manufacturing a semiconductor device as claimed in claim 8, wherein the first annealing is carried out at a higher temperature and for a shorter period of time than those of the second annealing.

17. The method of manufacturing a semiconductor device as claimed in claim 1, wherein at the first step, the silicon film is an amorphous silicon film, and the silicon film becomes polycrystalline silicon in the first annealing.

18. A method of manufacturing a semiconductor device, comprising:
    a step of forming a silicon film on a first and second region of a semiconductor substrate;
    a step of ion-implanting P-type impurities in the first region and N-type impurities in the second region in this order into the silicon film; and
    a step of forming at least a silicide film and a metal film in this order on the silicon film, wherein
    after ion-implanting the P-type impurities, a first annealing is carried out before ion-implanting the N-type impurities, and a second annealing is carried out after the N-type impurities are ion-implanted.

19. The method of manufacturing a semiconductor device as claimed in claim 18, wherein the second annealing is carried out after the silicide film is formed and before the metal film is formed.

* * * * *